(12) United States Patent
Toma (10) Patent No.: US 8,654,858 B2
(45) Date of Patent: Feb. 18, 2014

(54) METHODS AND APPARATUS FOR DIFFERENTIAL ENCODING

(75) Inventor: Andrei E. Toma, Framingham, MA (US)

(73) Assignee: Comtech EF Data Corp., Tempe, AZ (US)

( * ) Notice: Subject to any disclaimer, the term of this patent is extended or adjusted under 35 U.S.C. 154(b) by 1779 days.

(21) Appl. No.: 11/506,237

(22) Filed: Aug. 18, 2006

(65) Prior Publication Data

US 2007/0047657 A1 Mar. 1, 2007

Related U.S. Application Data

(60) Provisional application No. 60/711,142, filed on Aug. 25, 2005.

(51) Int. Cl.
 *H04N 7/12* (2006.01)
 *H04N 11/02* (2006.01)
 *H04N 11/04* (2006.01)
 *H04L 12/16* (2006.01)
 *H04Q 11/00* (2006.01)

(52) U.S. Cl.
 USPC ............... 375/240.24; 375/240.2; 370/260

(58) Field of Classification Search
 USPC .................. 375/240.01–240.29, 240.2
 See application file for complete search history.

(56) References Cited

U.S. PATENT DOCUMENTS

| | | | | |
|---|---|---|---|---|
| 4,580,134 A | * | 4/1986 | Campbell et al. | 345/589 |
| 5,686,964 A | * | 11/1997 | Tabatabai et al. | 375/240.24 |
| 5,812,534 A | * | 9/1998 | Davis et al. | 370/260 |
| 5,861,922 A | * | 1/1999 | Murashita et al. | 375/240.24 |
| 6,335,766 B1 | * | 1/2002 | Twitchell et al. | 348/608 |
| 6,683,987 B1 | * | 1/2004 | Sugahara | 382/235 |
| 6,819,714 B2 | * | 11/2004 | Yamada et al. | 375/240.12 |
| 6,931,070 B2 | * | 8/2005 | Moore | 375/240.25 |
| 7,003,035 B2 | * | 2/2006 | Tourapis et al. | 375/240.12 |
| 7,200,275 B2 | * | 4/2007 | Srinivasan et al. | 382/239 |
| 7,684,491 B2 | * | 3/2010 | Wang | 375/240.24 |
| 2003/0007507 A1 | * | 1/2003 | Rajwan et al. | 370/468 |
| 2003/0046711 A1 | * | 3/2003 | Cui et al. | 725/134 |
| 2004/0161039 A1 | * | 8/2004 | Grundstrom et al. | 375/240.24 |
| 2005/0052578 A1 | * | 3/2005 | Phillips et al. | 348/584 |

* cited by examiner

*Primary Examiner* — Christopher Kelley
*Assistant Examiner* — Hee-Yong Kim
(74) *Attorney, Agent, or Firm* — Booth Udall Fuller, PLC (57) ABSTRACT

A data stream encoder eliminates duplicate transmission units in a transmitted data stream in which the detected duplicate may not be the immediately preceding transmission unit. A data aggregator transmits a stream of data by identifying a frame interval, or timing interval, corresponding to the time to send a frame of data in the stream. Each of the frames includes a predetermined number of blocks. Configurations identify repetition patterns in the blocks of successive frames, thus looking backward a frame interval to identify a previous corresponding block in the preceding frame. The corresponding transmission block need not be the immediately preceding block or transmission unit. For certain types of data, successive frames exhibit the same or similar patterns in the blocks of data defining the frame. Therefore, the encoder identifies duplicate blocks in successive frames, and transmits only the blocks that differ from a counterpart block in the previous frame.

14 Claims, 7 Drawing Sheets

METHODS AND APPARATUS FOR DIFFERENTIAL ENCODING

CROSS REFERENCE TO RELATED APPLICATIONS

This Patent Application claims priority under 35 U.S.C. §119(e) to U.S. Provisional Patent Application No. 60/711,142 filed on Aug. 25, 2005, entitled, "DIFFERENTIAL ENCODING ALGORITHMS", the contents and teachings of which are hereby incorporated by reference in their entirety.

BACKGROUND

In a wireless communication system, wireless base transceiver stations (BTS, or base stations) are deployed throughput an area receiving wireless coverage. The base stations connect to an antenna in close proximity to provide a wireless link to end-user equipment, such as cell phones, PDAs, laptops, and other devices operable for wireless communication. A plurality of base stations connect to a base station controller, and ultimately to a public access network for connectivity to a remote party to the communication (i.e. remote endpoint). The public access network is typically a packet switched network such as the Internet or smaller scale interconnection such as intranets, extranets, virtual private networks (VPNs) and others.

While the individual wireless links between the user devices and the base station are typically single user, the communications between the base station and the base station controller, and between the base station controller and the network are often handled by high-speed trunk lines adapted to much more throughput (i.e. bandwidth). Frequently, such trunk lines are leased lines operable to provide various transport levels (speed) and services at a corresponding cost. Accordingly, efficient usage of the trunk lines is desirable to minimize the total volume of transmitted information. Therefore, service providers frequently perform reduction and optimization techniques such as compression and encoding on the trunk lines to reduce the total bandwidth requirement of such trunk line communication.

SUMMARY

In a conventional wireless system, high speed trunk lines provide communications between field deployed base transceiver stations and a mobile switching office having connections to public access networks such as the Internet. Such trunks may traverse one or more nodes between the base transceiver stations and the network ingress point. Configurations herein are based, in part, on the observation that the trunk lines often employ switching mechanisms that consolidate traffic according to traffic type and service levels, and identify and reduce or eliminate traffic that is redundant or unnecessary. Such switching mechanisms attempt to analyze connections requiring bandwidth on the trunk line, identify network traffic on connections that may be aggregated, reduced and/or compressed, and consolidate the collective payload of such connections to transport message traffic over the trunk in an efficient manner. In an exemplary configuration, such a switching mechanism may be that disclosed in copending U.S. patent application Ser. No. 11/358,730, filed Feb. 21, 2006, entitled METHODS AND APPARATUS FOR LOW LATENCY SIGNAL AGGREGATION AND BANDWIDTH REDUCTION, which claims priority to U.S. Pat. No. 7,072,296, filed Aug. 1, 2003, entitled "METHODS AND APPARATUS FOR NETWORK SIGNAL AGGREGATION AND BANDWIDTH REDUCTION," both incorporated herein by reference.

Conventional switching mechanisms reduce bandwidth requirements, inter alia, by identifying duplicate transmissions. Such duplicate transmissions may be, for example, successive duplicate payloads of zero data, or other repeatable pattern, as may occur during periods of silence on a voice connection. Accordingly, conventional switching mechanisms may employ a protocol that identifies duplicate transmission units (i.e. packet or frame) and indicate a duplicate successive frame with an indicator or signal that occupies less bandwidth than the transmission it replaces. However, such conventional mechanisms suffer from the shortcoming that they only examine the immediately preceding unit of communication to identify duplicate or redundant transmissions.

Accordingly, configurations herein substantially overcome the above described shortcomings by examining a corresponding transmission unit in a transmitted data stream which may not be the immediately preceding transmission unit. Configurations herein disclose a method for transmitting a stream of data by identifying a frame interval, or timing interval, corresponding to the time to send a frame of data in the stream. Each of the frames includes a predetermined number of blocks. Configurations herein identify repetition patterns in the blocks of successive frames, thus looking backward a frame interval to identify a previous corresponding block in the preceding frame. In a typical communication stream over a particular connection, successive frames exhibit particular entropy, or disorder between blocks in successive frames. For particular connections transporting certain types of data, successive frames exhibit the same or similar patterns in the blocks of data defining the frame. Therefore, the disclosed arrangement attempts to identify duplicate blocks in successive frames, and transmit only the blocks that differ from a counterpart block in the previous frame.

Conventional methods examine the immediate previous block, and omit transmission of a duplicate successive block. In contrast, the present claims define a system that examines a previous block in a corresponding position of a previous frame. The frame defines a number of blocks depending on the type of traffic, the transmission speed, and other factors. In this manner, configurations analyze blocks transmitted a frame interval previous, thus looking back a frame's worth of blocks, rather than examining the immediately previous block, or transmission unit. In this manner, configurations herein identify successive block patterns in the frames of a data stream, and transmit only the blocks in the frame that exhibit differences, rather than requiring complete duplication in the immediate preceding (block or frame) transmission unit.

In further detail, the method of transmitting a data stream using differential encoding as disclosed herein includes establishing a frame interval indicative of a transmission period of a frame of data from a data stream, and encoding a plurality of blocks, in which each of a predetermined number of blocks defines a frame of the data stream. For each block, the method identifies a corresponding block in a previous frame of the data stream, such that the corresponding block is defined by the block in a corresponding block position in the previous frame interval (one frame interval previous). The sender compares each block to the corresponding block from the data stream, and determines if the block is similar to the corresponding block. The sender selectively transmits, if the block is dissimilar to the previous corresponding block, the block, and the receiver retains a previous received value for the block if the block is similar to the corresponding block, thus avoiding transmission of the corresponding block.

At the sending side of the trunk line, in which the data stream has block of data in frames defined by frame intervals, such that each of a predetermined number of blocks defining a frame, the sending aggregator receives a current block for transport, typically from a user wireless device. The sender compares the current block to a corresponding previous block, in which the corresponding previous block has a similar position relative to other blocks in the previous frame. The sender therefore transmits, if the current block differs from the corresponding previous block, the current block.

At the receiver, processing the encoded data frames in a received stream of blocks includes storing a sequence of blocks in a frame buffer, the blocks defining a frame of data in a transmission stream, such that the frame buffer is operable to store a predetermined number of blocks as a sequence of blocks corresponding to the frame. The receiver advances a block pointer to a block position indicative of the next block receivable in the transmission stream, in which the block position corresponds to a frame interval for receiving the sequence of blocks in a frame. The receiver overwriting, if a block is received during the block interval, the value in the block position in the frame buffer, and retains, if a block is not received during the block interval, the value of the previous block in the frame buffer. The receiver continues advancing the block pointer, overwriting and retaining of blocks during the frame interval until the expiration of the frame interval, and then forwarding, after the expiration of the frame interval, the sequence of blocks in the frame buffer as the current frame. Only the changed blocks will have been overwritten, and the unchanged blocks are carried through from the buffer as the current frame.

Alternate configurations of the invention include a multi-programming or multiprocessing computerized device such as a workstation, handheld or laptop computer or dedicated computing device or the like configured with software and/or circuitry (e.g., a processor as summarized above) to process any or all of the method operations disclosed herein as embodiments of the invention. Still other embodiments of the invention include software programs such as a Java Virtual Machine and/or an operating system that can operate alone or in conjunction with each other with a multiprocessing computerized device to perform the method embodiment steps and operations summarized above and disclosed in detail below. One such embodiment comprises a computer program product that has a computer-readable medium including computer program logic encoded thereon that, when performed in a multiprocessing computerized device having a coupling of a memory and a processor, programs the processor to perform the operations disclosed herein as embodiments of the invention to carry out data access requests. Such arrangements of the invention are typically provided as software, code and/or other data (e.g., data structures) arranged or encoded on a computer readable medium such as an optical medium (e.g., CD-ROM), floppy or hard disk or other medium such as firmware or microcode in one or more ROM or RAM or PROM chips, field programmable gate arrays (FPGAs) or as an Application Specific Integrated Circuit (ASIC). The software or firmware or other such configurations can be installed onto the computerized device (e.g., during operating system or execution environment installation) to cause the computerized device to perform the techniques explained herein as embodiments of the invention.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Differential encoding as disclosed herein includes transmitting a stream of data by identifying a frame interval, or timing interval, corresponding to the time required to send a frame of data in the stream. Each of the frames includes a predetermined number of blocks. Configurations herein identify repetition patterns in the blocks of successive frames, thus looking backward a frame interval to identify a previous corresponding block in the preceding frame. Such corresponding blocks are those transported in the previous frame in the same block timeslot, e.g. the previous $5^{th}$ block of a frame for a current $5^{th}$ block, or 1 frame interval previous. In a typical communication stream over a particular connection, successive frames exhibit particular entropy, or disorder between blocks in successive frames. For particular connections transporting certain types of data, successive frames exhibit the same or similar patterns in the blocks of data defining the frame. Therefore, configurations herein attempt to identify duplicate blocks in successive frames, and transmit only the blocks that differ from a counterpart (corresponding) block in the previous frame.

Figure 1:
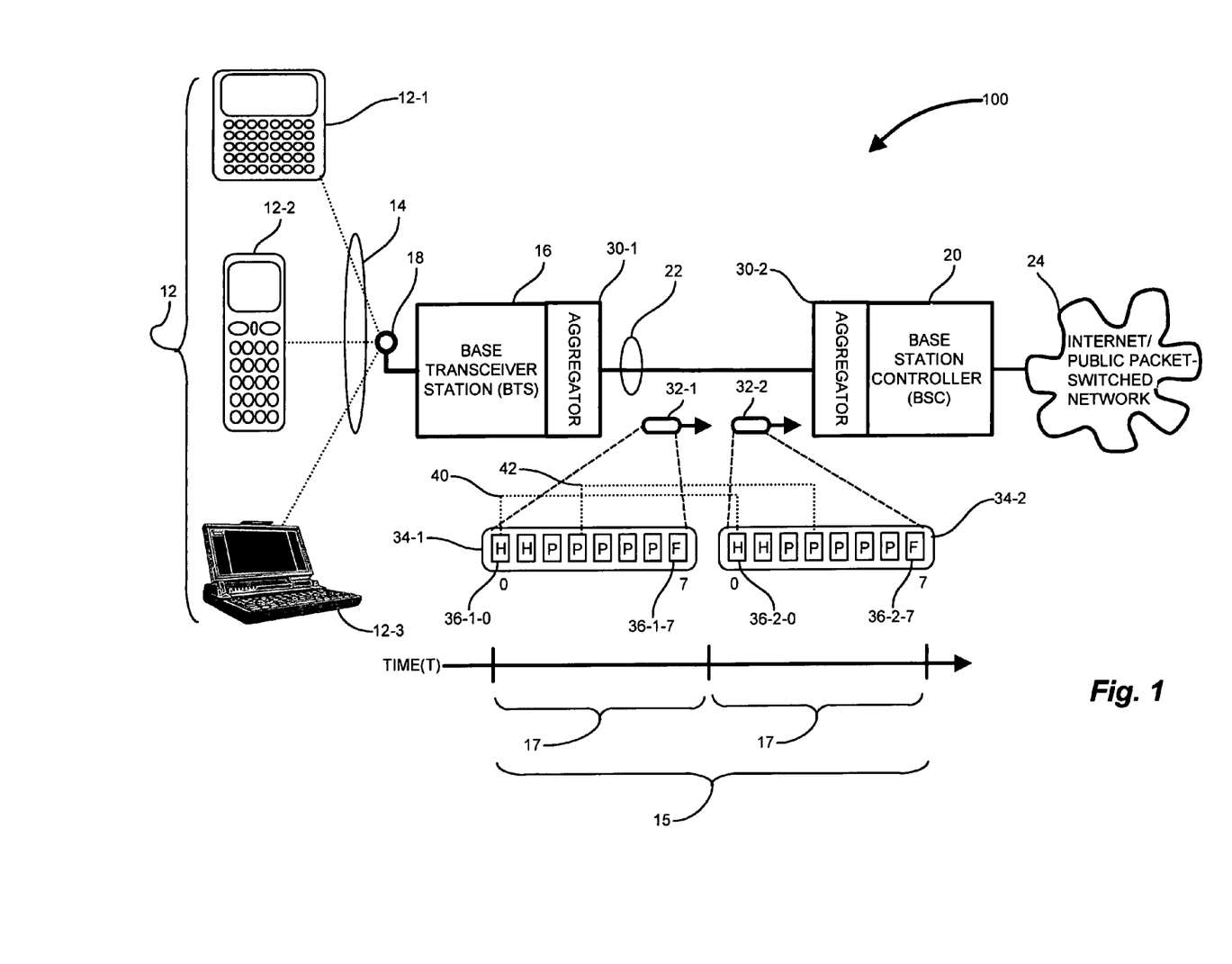
FIG. 1 is an exemplary wireless environment suitable for use with configurations herein.

FIG. 1 is an exemplary wireless environment suitable for use with configurations herein. Referring to FIG. 1, an exemplary wireless environment 100 provides wireless services to users via user devices 12, such as personal digital assistants (PDAs) 12-1 (e.g. Blackberrys™), cellphones 12-2, wireless enabled laptops 12-3 (e.g. wifi 802.11b/g conversant) and others not specifically shown. Wireless devices 12 generally maintain a wireless link 14, or connection, to a base transceiver station (BTS) 16 via an antenna 18. The BTS 16 connects to a base station controller (BSC) 20 via a trunk line 22 operable to support high-speed data transport from a number of users 12. The BSC may also connect to a plurality of other BTSs 16, each having respective user links 14, depending on network topography. The base station controller 20 also maintains a connection to a packet switched network 24 such as the Internet for routing message traffic to and from a remote destination (not specifically shown).

One or more trunk lines 22 transport message traffic between the BTS and BSC. The trunk lines 22 are generally high bandwidth links operable to transport many connections corresponding to the user links 14. The trunk line 22 may be subject to leasing terms and/or service level agreements (SLAs) that define a particular cost for bandwidth usage. It is therefore beneficial to manage and optimize the collective bandwidth required to support user connections transported by the links 14. Accordingly, in the exemplary configuration, an aggregator 30-1, 30-2 (30 generally) aggregates message traffic from multiple connections to reduce total bandwidth, generally by identifying redundant and recreatable information that need not be transported. Such aggregators typically employ a specialized protocol that bundles data from multiple connections 14. The aggregators 30, therefore, identify information that is recreatable or redundant, omit or substitute an indicator in place of the recreatable or redundant information, and reassemble and/or regenerate the data transported via the respective connections 14 at the receiving end 30-2. In an exemplary configuration, the aggregators 30 may be an AccessGate device, marketed commercially by NMS Communications of Framingham, Mass., assignee of the present application. Alternatively, other compression and/or multiplexing mechanisms may be employed for managing optimization of the trunk lines 22.

The message traffic on the trunk line 22 takes the form of message packets 32-1, 32-2 (32 generally). Each of the message packets 32 includes a frame 34-1 . . . 34-2 (34 generally) of data. Each of the frames 34 further includes a set of blocks 36-1-0 . . . 36-2-7 (36 generally), according to a predetermined criteria based on the transmission speed and the frame size. The frames collectively define a stream of data 15 corresponding to a connection 14. In general, each frame 34 has a frame interval 17 indicative of the time to transport the frame 34, and each frame 34 is further subdivided into a number of blocks 36, each having data bits, based on the number of bits that fit in the block 36. In an exemplary configuration, a frame is 20 msec and includes 20 blocks. Therefore, each block includes 1 msec of data, which on an 8 Kbps line is 8 bits. Similarly, a 16 Kbps line supports 16 bit, or 2 byte blocks.

Each frame 34, therefore, includes a predetermined number of blocks 36, eight in the example shown in FIG. 1. Each block 36 occupies a block position relative to its order in the frame 34, denoted by positions 0-7 in the disclosed configuration. Further, the frame 34 has portions, or fields, of block data, such as header (H), Payload (P), and Filler (F). Often, in a transmission stream 15 of frames 36, successive frames have similar values in corresponding block positions, particularly for blocks of the same field types. i.e. the 1st block of each frame 34, shown by dotted line 40. For example, in a stream 15 of data the header blocks H often differ by a single incremental digit; the remaining header fields are the same as previous frames 34. By way of further example, in a stream of voice data, periods of silence are often represented by similar payload P blocks. Accordingly, in a stream of voice data representing silence, the corresponding payload blocks 36 contain similar values between successive frames, shown by dotted line 42, depicting the 4th block of successive frames. The filler blocks F, as well, are likely to contain similar values in successive frames 34.

Configurations herein, therefore, examine the corresponding block in the previous frame 34 to identify a similar value. In the above example, denoting similar payload blocks, a continuous silence period results in the corresponding blocks 2-6 (36-1-2 . . . 6 and 36-2-2 . . . 6) of each frame 34. Conventional mechanisms that examine the frame 34 as the transmission unit would not detect a similar transmission if even the sequence number in the header H changed. Similarly, mechanisms that examine the previous block 36 would not identify similar headers or filler fields across successive frames 36. However, in configurations herein, by examining the corresponding block 36, or block occupying a similarly position, in the previous frame, duplications and redundancy in a stream of frames is detectable. Accordingly, blocks 36 are compared not to an immediately previous block 36, but to the previous corresponding block 36 in the preceding frame 34, determinable by the block 36 occurring a frame interval 17 previous (20 ms, in the exemplary configuration). Blocks 36 having a similar value as their counterpart (40, 42) need not be transmitted, thus resulting in bandwidth savings over the trunk line 22.

For example, in a voice connection, user silence is typically replaced with a predetermined pattern. Such a predetermined silence pattern is represented by a silence insertion descriptor (SID) in the payload of the message packet, followed by successive frames of the predetermined silence pattern. While not necessarily zeros, this silence insertion pattern is repeated for successive frames of silence (actually, background noise to avoid a dead line perception). However, the header blocks 36 of such a silence frame 34 differ slightly by a sequence number. In the configuration herein, the blocks having the silence pattern, as well as header blocks 36 not having a sequence number, are identifiable as similar corresponding blocks 36 and need not be transmitted.

Figure 2:
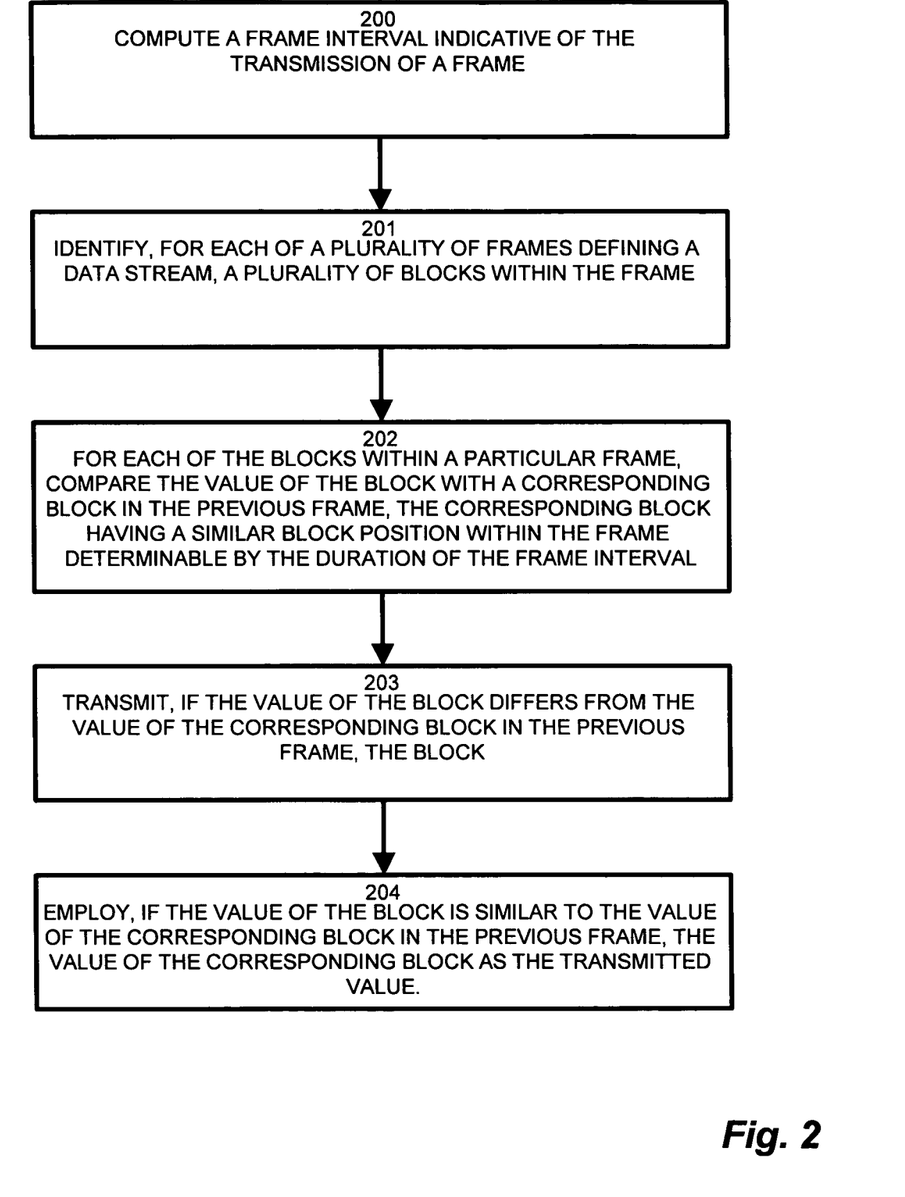
FIG. 2 is a flowchart of frame and data block transmission in the environment herein.

FIG. 2 is a flowchart of frame and data block transmission in the environment herein. Referring to FIGS. 1 and 2, the method for transmitting a stream of encoded data as defined herein includes, at step 200, computing a frame interval indicative of the transmission of a frame, and identifying, for each of a plurality of frames defining a data stream, a plurality of blocks within the frame, as depicted at step 201. The data stream includes a frames, each subdivided into blocks. During each frame interval 17, the data stream 15 transports a fixed number of blocks 36, each within a substantially equal block period, or time slice, determinable by equal subdivisions of the frame 34 into the number of blocks 36 in the frame interval 17, each block occupying an incremental block position (1st, 2nd, 3rd, etc.) within the frame 34.

For each of the blocks 36 within a particular frame 34, the method compares the value of the block with a corresponding block 36 in the previous frame 34, in which the corresponding block 36 has a similar block position within the frame 36 determinable by the duration of the frame interval 17, as shown at step 202. A check is performed, and the BTS transmits, if the value of the block differs from the value of the corresponding block in the previous frame, the block, as shown at step 203, and employs, if the value of the block is similar to the value of the corresponding block in the previous frame, the value of the corresponding block as the transmitted value, as depicted at step 204. Therefore, if a particular block has the same value as the previous corresponding block (1st, 2nd, etc.), the block 36 is not sent and the previously received value is reused for the particular block 36. In this manner, commingled changed and unchanged blocks in a frame 34 are aggregated into the proper received frame by reusing values from the previous block 36 if a new value is not received in the block period for the particular block. Bandwidth not needed for block transport is employable by other streams or connections 14, in accordance with the operation of the aggregator 30.

Figure 3:
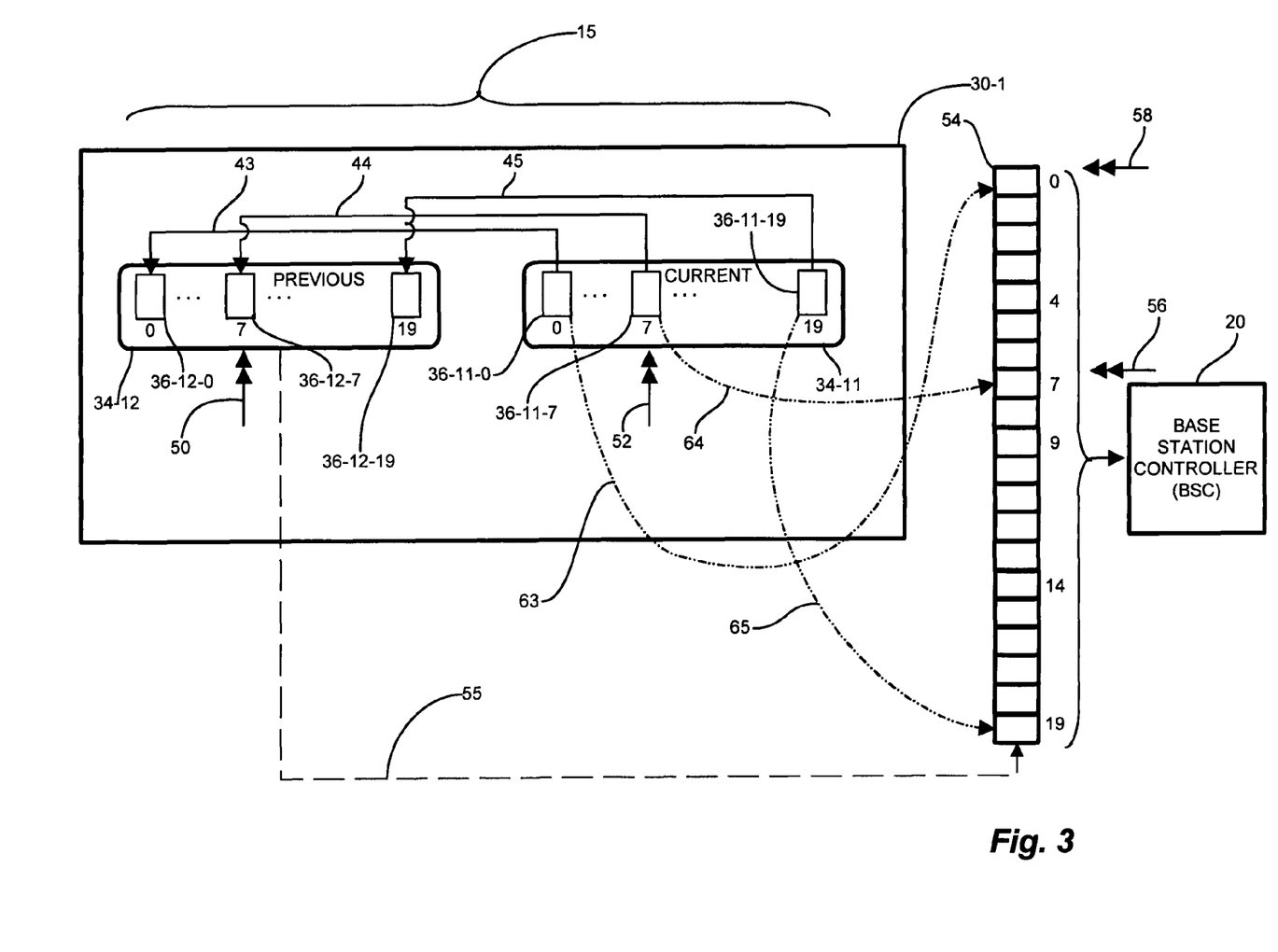
FIG. 3 is a block diagram of data block transmission via an aggregator as disclosed herein.
Figure 4:
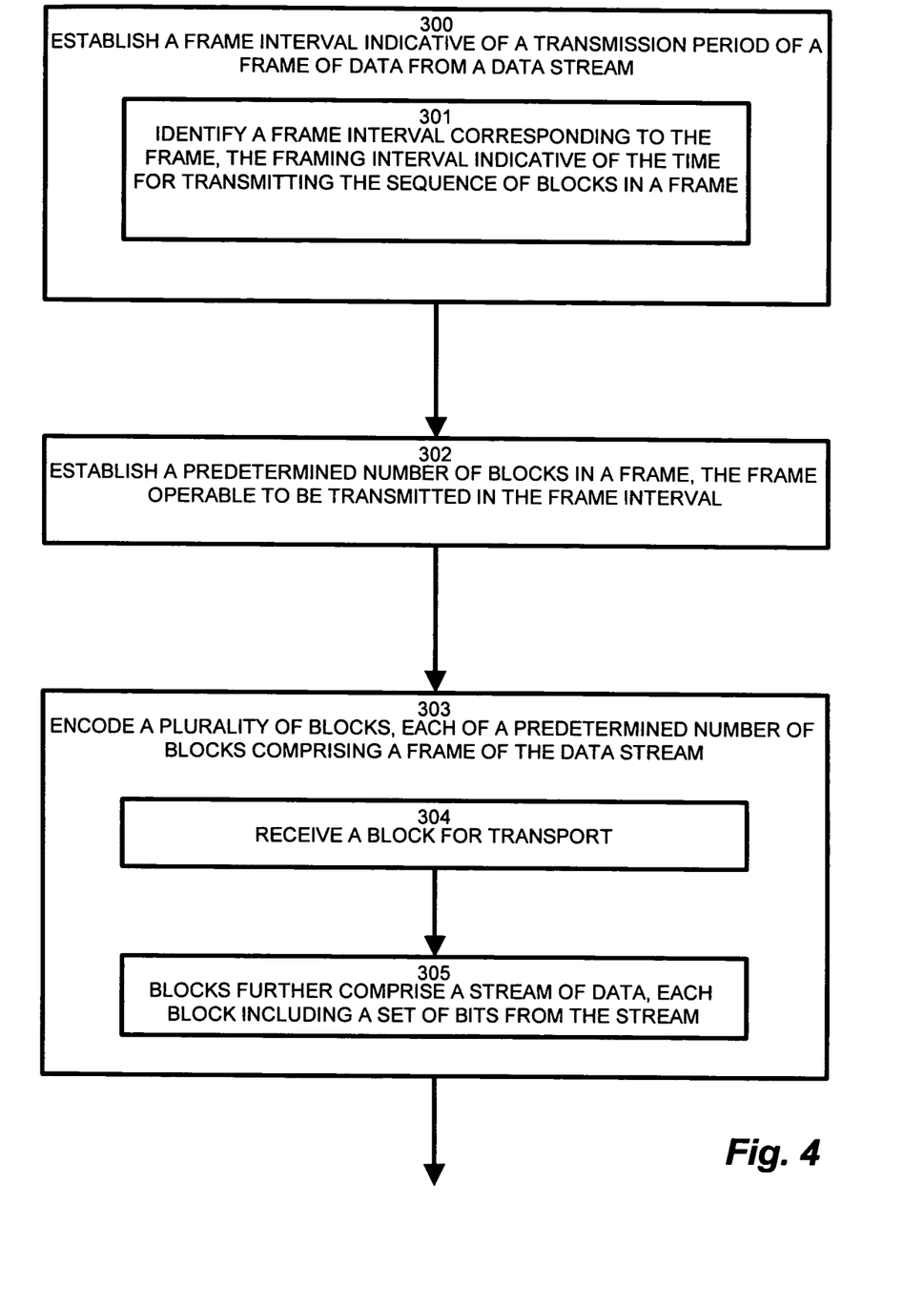
FIGS. 4-7 are a flowchart of differential encoding of data frames in the system of FIG. 3.
Figure 5:
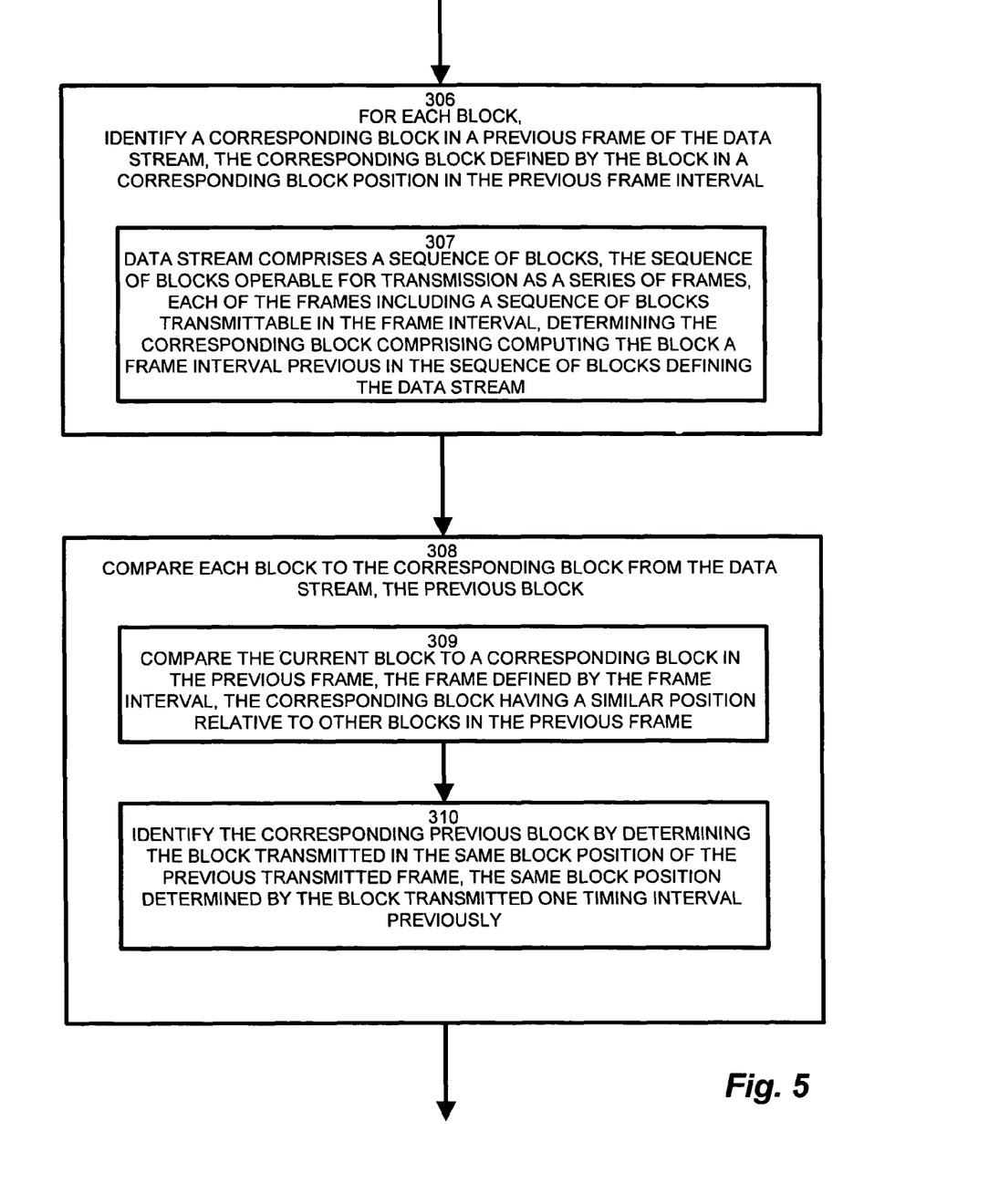
Figure 6:
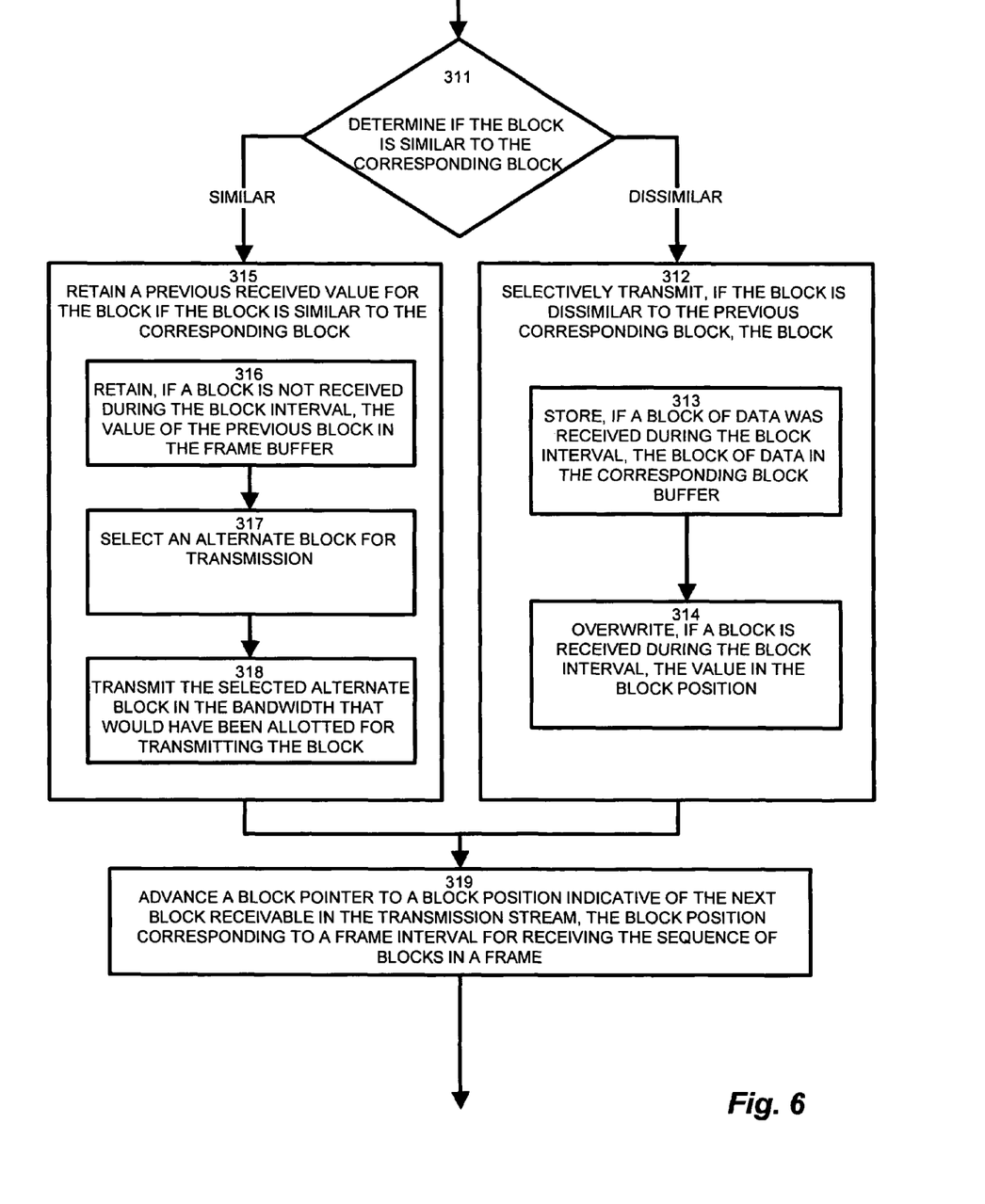
Figure 7:
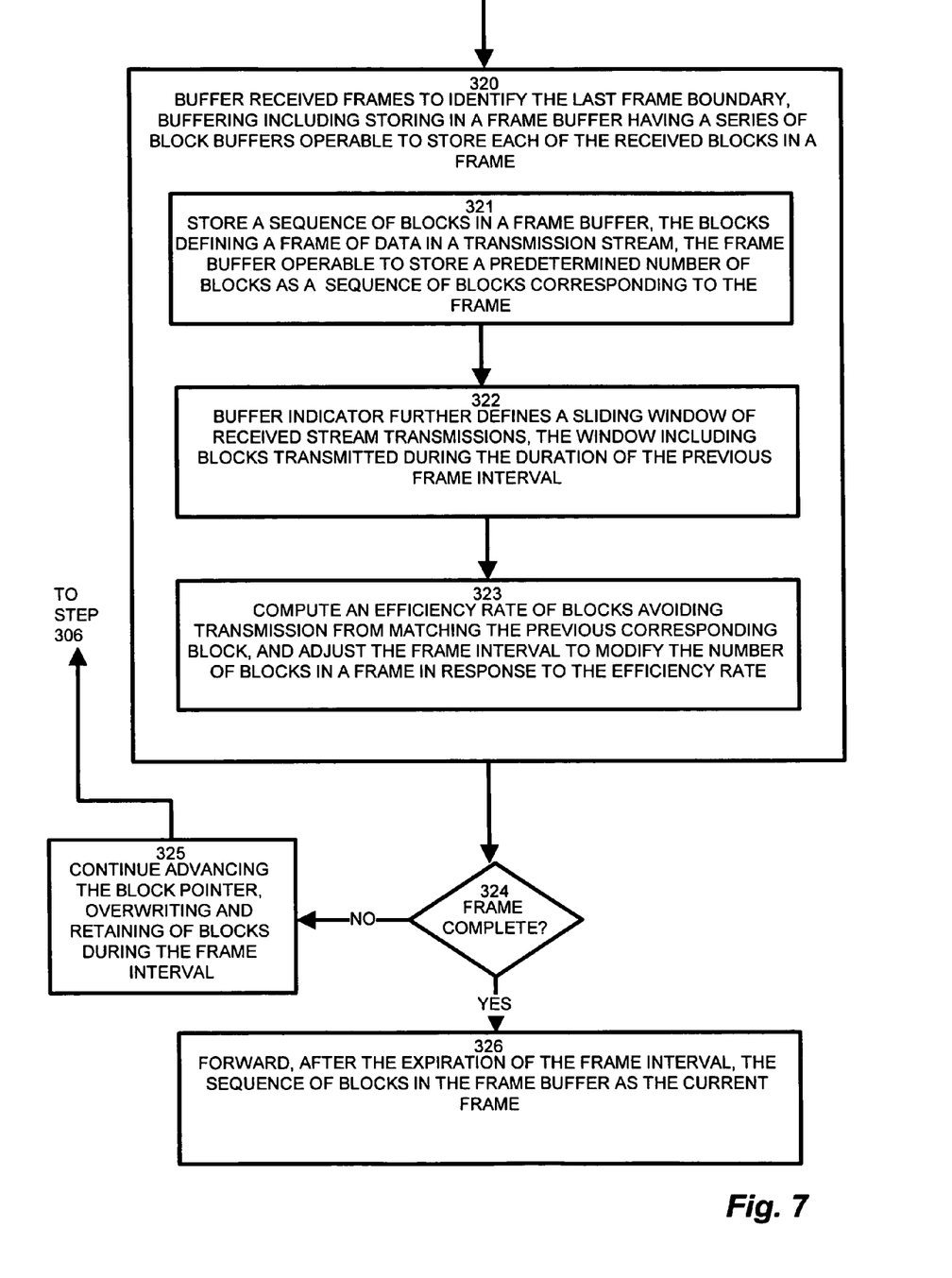

FIG. 3 is a block diagram of data block transmission via an aggregator 30 as disclosed herein. Referring to FIGS. 1 and 3, consecutive frames 34-11 and 34-12 are shown. Each of the frames 34 have 20 blocks, of which corresponding blocks 0, 7 and 19, are shown by lines 43-45 respectively. A current block pointer 52 indicates a current transmission block 36-11-7 for which a corresponding block 36-12-7 is being analyzed. A previous block pointer 50 points to the corresponding block 36 in the previous frame 34 to which a comparison is being made. A current receive buffer 54 indicates the frame currently being received for transport from the trunk line 22 (i.e. transmitted on the data stream from the BTS 16). The current receive buffer 54 initially contains the block 36 values in the last frame 34-12 received, and thus includes values taken to the previous frame 34-12, as shown by arrow 55.

On the transmitting side, the aggregator 30-1 at the BTS 16 compares each block 36-11-N to the corresponding previous block 36-12-N, designated by arrows 43-45 (corresponding block pairs 0, 7 and 19 are shown for convenience; the full transmission analyzes each of the 20 blocks). For each block 36, if a different value is found in the corresponding block, then the block is transmitted. In the example shown, blocks 32-11-0, 32-11-7, and 32-11-19 exhibit differences. Therefore, only blocks 0, 7 and 19 are transmitted from the sending aggregator 30-1. Upon receipt at the receiving aggregator 30-2, only the changed block values are written into the receive buffer 54, as shown by arrows 63, 64 and 65. Since the receive buffer 54 already contains values of the previous frame 34-12 from earlier transmissions, only the changed values 63-65 are rewritten, thus overwriting the changed blocks. The receive buffer 54 is then received by the BSC 20 as a complete frame of data for frame 34-11.

FIGS. 4-7 are a flowchart of differential encoding of data frames in the system of FIG. 3. Referring to FIGS. 1 and 3-7, the method for transmitting a data stream 15 using differential encoding as defined herein includes establishing a frame interval 17 indicative of a transmission period of a frame of data 34 from the data stream 15, as depicted at step 300, and identifying the frame interval 17 corresponding to the frame 34, in which the framing interval 17 is indicative of the time for transmitting the sequence of blocks 36 in a frame 34, as shown at step 301. Each frame 34, therefore, includes a predetermined number of blocks 36 based on the number of blocks 36 which can be transmitted during the frame interval 17 (in other words, can "fit" in the frame). In the exemplary arrangement, the frames are 20 msec in duration and include 20 blocks, thus each block is 1 msec and includes 8 bits of data on an 8 Kbps connection. Alternate arrangements include 16 Kbps connections having 2 bytes (16 bits) per block, however any suitable frame interval and transmission speed maybe employed, as will be discussed further below. Accordingly, the sending aggregator 30-1 establishes a predetermined number of blocks 36 in a frame 34, such that the frame 34 is operable to be transmitted in the frame interval 17, as depicted at step 302. Alternate configurations, discussed further below, dynamically modify the frame interval 17 so as to maximize the periodic duplication found.

From the data stream 15 of frames 34-M, the aggregator 30-1 encodes a plurality of blocks 36, in which each of a predetermined number of blocks 36 comprise a frame 34 of the data stream 15, as shown at step 303. From the data stream, the aggregator 30-1 receives a block 36 for transport, typically from a connection 14 to a user device 12, as depicted at step 304. The blocks 36 therefore define the stream of data 15, in which each block 36 includes a set of bits from the stream 15, as depicted at step 305.

The data stream 15 from a respective user device 12 therefore includes a series of frames 34, each including a sequence of blocks 36. For each block 36-11 the sending aggregator 30-1 receives for transmission over the trunk line 22, the aggregator 30-1 identifies a corresponding block 36-12 in the previous frame 34-12 of the data stream 15, in which the corresponding block 36 is defined by the block in a corresponding block position 36-12-N in the previous frame 36-12, as depicted at step 306. In the exemplary configuration, the data stream is defined by a sequence of blocks 36, such that the sequence of blocks 36 is operable for transmission as a series of frames 34, in which each of the frames 34 includes the sequence of blocks 36-M transmittable in the frame interval (i.e. 20, in the exemplary 20 msec frame), as depicted at step 307. Determination of the corresponding block 36 includes computing the block 36 occurring a frame interval previous (i.e. the block 20 msec previous) in the sequence of blocks 36 defining the data stream 15.

Once determining the corresponding block 36, the transmitting aggregator 30-1 compares each block 36-M-N to the corresponding block 36-(M+1)-N from the data stream 15, as shown at step 308. This includes comparing the current block 36-M-N to a corresponding block 36-(M+1)-N in the previous frame 34-(M+1), in which the frame 34 is defined by the frame interval 17, and the corresponding block has a similar position N relative to other blocks 36 in the previous frame 34-(M+1), as shown at step 309. Therefore, the aggregator 30-1 identifies the corresponding previous block 36-(M+1)-N by determining the block 36-(M+1)-N analyzed in the same block position N of the previous transmitted frame 34-(M+1), in which the same block position is determined by the block 36 transmitted one timing interval (e.g. 20 msec) previously, as depicted at step 310.

A check is performed, at step 311, to determine if the block 36-M-N is similar to the corresponding block 36-(M+1)-N. The aggregator 30-1 selectively transmits, if the block 36-M-N is dissimilar to the previous corresponding block 36-(M+1)-N, the block 36-M-N, as depicted at step 312. Therefore, the aggregator 30-1 does not transmit the block 36 if the previous block value may be employed. The receiving aggregator 30-2 therefore stores, if a block of data 36 was received during the block interval, the block of data in the corresponding block buffer 54-N, as shown at step 313, and overwrites, the previous value in the block position N, as depicted at step 314.

The sending aggregator 30-1 thus does not transmit the block 36-M-N if a match is found at step 311, therefore retaining a previous received value for the block 36 if the block 36-M-N is similar to the corresponding block 36-(M+1)-N, as shown at step 315. The receiving aggregator 30-2 retains, if a block 36 is not received during the block interval, the value of the previous block 36 in the frame buffer 54-N, as shown at step 316. In such an instance, retaining further comprises selecting an alternate block for transmission, as shown at step 317, as the sending aggregator 30-1 employs the unused bandwidth for other data, as disclosed in the above referenced copending patent application. The sending aggregator 30-1 transmits the selected alternate block in the bandwidth that would have been allotted for transmitting the block 36-(M+1)-N, as depicted at step 318.

Further, at various times in the transmission, the aggregator 30-1 may send a resynchronization indicator to reestablish the frame interval 17 and first block in the frame interval, if irregularities occur in processing the data stream or to change the frame interval 17 and thus, the frame size, discussed further below. In either case, the aggregator 30-1 advances the buffer indicators 50, 52 to the next block 54-N, as depicted at step 319.

Accordingly, the receiving aggregator 30-2 advances the block pointer 56 to a block position 54-N indicative of the next block receivable from the transmission stream 15, in which the block position 54-N corresponds to the frame interval for receiving the sequence of blocks 36 in the frame 34, as shown at step 320. The receiving aggregator 30-2 buffers the received frames 34 to identify the last frame boundary 58, in which buffering includes storing in a frame buffer 54 having a series of block buffers 54-0 . . . 19 operable to store each of the received blocks 36 from a frame 34, as shown at step 321. The receiving 30-2 aggregator thus stores a sequence of blocks 36 in the frame buffer 54, in which the blocks define a frame 34 of data in a transmission stream, such that the frame buffer 54 is operable to store a predetermined number of blocks 36 as a sequence of blocks 36 corresponding to the frame 34.

In the exemplary arrangement, the buffer indicator 58 further defines a sliding window of received stream transmissions, such that the window includes blocks 36 transmitted during the duration of the previous frame interval 17, as shown at step 322. The sliding window is an adaptive sliding window, and the aggregator 30 computes an efficiency rate of blocks avoiding transmission from matching the previous corresponding block. The aggregator 30 adjusts the frame interval 17 to modify the number of blocks in a frame in response to the efficiency rate, as depicted at step 323.

A check is performed, at step 324, to determine if the current frame 34 is complete, and if not, control reverts to step 306 to continuing advancing the current block pointer 52, and previous block pointer 50, and overwriting and retaining of blocks during the frame interval 17, as shown at step 325. If the frame 34 is complete, then the receiving aggregator 30-2 forwards, after the expiration of the frame interval 17, the sequence of blocks 36 in the frame buffer 54 as the current frame 34, as shown at step 326.

Alternate configurations employ a variable frame interval of the ATF (Any type frame) encoding by eliminating the need to know a priori the period interval by both compressor and decompressor (30-1, 30-2). In general, of application of the above described differential encoding is beneficial where the input content is packetized/framed in such a way that the difference of entropy between corresponding portions of the packetized/framed content is small. In particular, one context where such information is sent in a packetized/framed format is a wireless A-bis interface. The A-bis interface is defined by 3GPP as being located between BTS (Base Transceiver Station) and the BSC (Base Station Controller).

The traffic exchanged over the A-bis interface is sent/received over a synchronous PCM link with a max 2.048 Mbit/sec or 1.544 for E1 and respective for T1 trunk types.

On the A-bis interface, the data transferred is packetized in HDLC format or framed in TRAU format. The HDLC traffic is defined to be a combination of HDLC flags and HDLC packets. The HDLC flags are used to separate the HDLC packets, with the intention to transfer packetized data over a synchronous link. Since consecutive HDLC flags have the same value they are a good candidate to be compressed using a differential encoding mechanism such as that disclosed herein.

By way of background, the TRAU format is a frame format defined in 3GPP TS 48.061 and 48.060. Each TRAU frame has a nominal duration of 20 msec that will correspond to a nominal size of 20 or 40 bytes depending of the net data rate allocated to that subchannel. For example, in a 64 Kbps PCM TS could be 4×16 kbps subchannels or 8×8 kbps subchannels or a combination of them. The 16 kbps subchannels carry 40 bytes frames and the 8 kbps subchannels carry 20 bytes frames. Based on the structure and the content of the TRAU frames it exist identities or similarities between portions of the frame. The TRAU 'idle' frames well adapted for inclusion of corresponding blocks include for example: Speech Idle. Silence frames, SID frames, PCU idle, and others.

In conventional approaches, the transmitter will analyze consecutive bytes and will not send the current byte in case it is identical with the preceding byte. The receiver will reconstruct the initial byte stream by duplicating every byte not sent by the transmitter based on the last one received. In contrast, the disclosed differential encoding mechanism compares not consecutive bytes, but bytes located 20 msec apart in time. This means for example for an 8 Kbps subchannel to compare two bytes separated by 19 bytes.

Another content type amenable to configurations herein and present on the A-bis interface is a constant bit value i.e. 0x54 or 0x55. This content it is present on the TS that belong to the PCM trunk but they are not currently used for signaling or bearer channels. For this type of traffic any one of the above differential encoding algorithms will reduce the amount of data to be send. In this manner, differential encoding may be employed to reduce the amount of information that has to be sent between a transmitter and a receiver that have the task to compress and respectively decompress a plurality of specific incoming sources of traffic (i.e. connection).

Alternate configurations vary the frame interval by modifying the size of the sliding window on the data stream, as follows. A T_ATF value indicative of the framing interval, and hence the number of blocks in a frame, is employed to perform data comparison. The compressor (sending aggregator 30-1) should send the T_ATF value to the decompressor (30-2) using an "out-of-band" method. The transmission method is considered "out-of-band" because the information exchanged in not part of the compressed bitstream produced by the compressor.

The T_ATF value is computed continuously by the compressor by monitoring the input data stream. The compressor determines what would be the success rate for multiple possible values. For example the compressor could try few potential T_ATF values (e.g. 20, 1, 10) and see which one will generate the highest score of successful compressions in an interval of time (e.g. 60 seconds).

Once the compressor determine the best T_ATF value it will send an "in-band or out-of-band" message to the decompressor. Since the decompressor always uses the last received value of T_ATF, in order to avoid any data reconstruction glitches a new policy has to be applied to the compressor:

If the new T_ATF value is different from the value currently used, then the compressor will produce/send uncompressed data for a duration long enough to allow the "in-band or out-of-band" message to be received by the decompressor.

If the new T_ATF value is the same as the value currently used, then the compressor will produce compressed data as usual.

In an exemplary arrangement of sliding window (framing interval) computation, the following signaling layers are employed: the compressor resides in the DSP that perform TX processing and the decompressor resides in the DSP that perform RX data reconstruction. The TX compressor and RX de-compressor, as are known in the art, process 1 msec amount of data from service trunks. For the case of when TX compressor has to process some unknown "TRAU-like" frames that are somehow similar with the 20 msec 3GPP TRAU frames then the T_ATF has to be set to 20. If the TX compressor is processing HDLC frames (as it does today when FAST_CLEAR signaling processing mode is selected) then the T_ATF has to be set with 1. The "out-of-band" message is send from the TX compressor to the RX de-compressor in the following way: the TX compressor generates an unsolicited event to the local Control element, the local Control element sends to the remote Control element a message that describe the channel id and the associated T_ATF value, the remote Control element sends to the RX de-compressor an configuration command to that channel.

Those skilled in the art should readily appreciate that the programs and methods for transmitting a stream of encoded data via differential encoding techniques as defined herein are deliverable to a processing device in many forms, including but not limited to a) information permanently stored on nonwriteable storage media such as ROM devices, b) information alterably stored on writeable storage media such as floppy disks, magnetic tapes, CDs, RAM devices, and other magnetic and optical media, or c) information conveyed to a computer through communication media, for example using baseband signaling or broadband signaling techniques, as in an electronic network such as the Internet or telephone modem lines. The disclosed method may be in the form of an encoded set of processor based instructions for performing the operations and methods discussed above. Such delivery may be in the form of a computer program product having a computer readable medium operable to store computer program logic embodied in computer program code encoded thereon, for example. The operations and methods may be implemented in a software executable object or as a set of instructions embedded in a carrier wave. Alternatively, the operations and methods disclosed herein may be embodied in whole or in part using hardware components, such as Application Specific Integrated Circuits (ASICs), Field Programmable Gate Arrays (FPGAs), state machines, controllers or other hardware components or devices, or a combination of hardware, software, and firmware components.

While the system and method for transmitting a stream of encoded data via differential encoding techniques has been particularly shown and described with references to embodiments thereof, it will be understood by those skilled in the art that various changes in form and details may be made therein without departing from the scope of the invention encompassed by the appended claims.

What is claimed is:

1. A method for transmitting a stream of encoded data comprising:
   computing a frame interval indicative of the transmission of a frame;
   identifying, for each of a plurality of frames defining a data stream, a plurality of blocks within the frame;
   for each of the blocks within a particular frame, comparing the value of the block with a corresponding block in the previous frame, the corresponding block having a block interval offset position within the frame determinable by the duration of the frame interval;
   transmitting, if the value of the block differs from the value of the corresponding block in the previous frame, the corresponding block defined by a positional similarity to the previous frame;
   employing, if the value of the block is equal to the value of the corresponding block in the previous frame, the value of the corresponding block as the transmitted value by advancing a receive buffer pointer to a next block in a sequence of blocks without overwriting the current block such that the block value from a previous frame defines the current block;
   accepting, upon transmission of all changed blocks in the frame, the receive buffer as the contents of a transmitted frame;
   wherein the data stream comprises a sequence of blocks, the sequence of blocks operable for transmission as a series of frames, each of the frames including a portion of the sequence of blocks transmittable in the frame interval, and determining the corresponding block by computing the block value from a corresponding block in the previous frame interval in the sequence of blocks in the data stream;
   buffering received frames by storing in a frame buffer having a series of block buffers operable to store each of the received blocks in a frame to identify the last frame boundary;
   advancing another block interval;
   storing, if a block of data was received during the block interval, the block of data in the corresponding block buffer; and
   advancing a buffer indicator to the next block portion, the buffer indicator further defining an adaptive sliding window of received stream transmissions that includes blocks transmitted during the duration of the previous frame interval, wherein the adaptive sliding window computes an efficiency rate of blocks avoiding transmission from matching the previous corresponding block and adjusts the frame interval to modify the number of blocks in a frame in response to the efficiency rate.

2. The method of claim 1 wherein the block comparison is for equal value with a corresponding block in the previous frame and transmitting the block if the value is unequal to the value of the corresponding block in the previous frame.

3. A non-transitory computer readable storage medium comprising a processor-executable instructions that, when executed by a processor, performs a method of transmitting a data stream comprising:
   establishing, by the processor, a frame interval indicative of a transmission period of a frame of data from a data stream;
   encoding a plurality of blocks, each of a predetermined number of blocks comprising a frame of the data stream;
   for each block, identifying a corresponding block in a previous frame of the data stream, the corresponding block defined by the block in a corresponding block position in the previous frame interval;
   comparing each block to the corresponding block from the data stream;
   determining if the block is equal to the corresponding block, the corresponding block defined by a positional similarity to the previous frame;
   selectively transmitting, if the block is unequal to the previous corresponding block, the block;
   retaining a previous received value for the block if the block is equal to the corresponding block, by advancing a receive buffer pointer to a next block in a sequence of blocks without overwriting the current block such that the block value from a previous frame defines the current block;
   accepting, upon transmission of all changed blocks in the frame, the receive buffer as the contents of a transmitted frame, the data stream comprising a sequence of blocks, the sequence of blocks operable for transmission as a series of frames, each of the frames including a portion of the sequence of blocks transmittable in the frame interval, determining the corresponding block comprising computing the block value from a corresponding block in the previous frame interval in the sequence of blocks defining the data stream;
   buffering received frames by storing in a frame buffer having a series of block buffers operable to store each of the received blocks in a frame to identify the last frame boundary;
   advancing another block interval;
   storing, if a block of data was received during the block interval, the block of data in the corresponding block buffer; and
   advancing a buffer indicator to the next block portion, the buffer indicator further defining an adaptive sliding window of received stream transmissions that includes blocks transmitted during the duration of the previous frame interval, wherein the adaptive sliding window computes an efficiency rate of blocks avoiding transmission from matching the previous corresponding block and adjusts the frame interval to modify the number of blocks in a frame in response to the efficiency rate.

4. The method of claim 3 wherein retaining comprises selecting an alternate block for transmission, and further comprising transmitting the selected alternate block in the bandwidth that would have been allotted for transmitting the block.

5. The method of claim 4 further comprising comparing the block to a corresponding block in the previous frame, the frame defined by the frame interval, the corresponding block having a similar position relative to other blocks in the previous frame.

6. The method of claim 3 further comprising sending a resynchronization indicator to reestablish the frame interval and first block in the frame interval.

7. The method of claim 3 wherein untransmitted values represent silence periods on a voice transmission and that the block comparison avoids header blocks that would mask otherwise equal block values for voice silence.

8. The method of claim 7 wherein the equality comparison includes packet payloads representing silence periods of voice data.

9. The method of claim 7 wherein the corresponding block of the frame is based on sequence defined by a frame interval.

10. The method of claim 7 wherein the equality comparison is of a message packet payload representing voice silence such that the comparison excludes packet headers and sequence numbers.

11. A differential encoding aggregator for transmitting a stream of data comprising:
a memory operable to store a processor based set of encoded instructions;
a processor responsive to the encoded instructions;
an interface for receiving a stream of data, the stream of data further comprising a series of frames, the instructions operable to direct the processor to:
compute a frame interval indicative of the transmission of a frame;
identify, for each of a plurality of frames defining a data stream, a plurality of blocks within the frame;
for each of the blocks within a particular frame, compare the value of the block with a corresponding block in the previous frame, the corresponding block defined by a positional similarity to the previous frame and having a similar block position within the frame determinable by the duration of the frame interval;
transmit, if the value of the block differs from the value of the corresponding block in the previous frame, the block;
employ, if the value of the block is similar to the value of the corresponding block in the previous frame, the value of the corresponding block as the transmitted value by advancing a receive buffer pointer to a next block in a sequence of blocks without overwriting the current block such that the block value from a previous frame defines the current block;
accept, upon transmission of all changed blocks in the frame, the receive buffer as the contents of the transmitted frame, the stream of data comprising a sequence of the blocks, the sequence of blocks operable for transmission as a series of the frames, each of the frames including a portion of the sequence of blocks transmittable in the frame interval, determining the corresponding block comprising computing the block value from a corresponding block in the previous frame interval in the sequence of blocks defining the data stream;
buffer received frames by storing in a frame buffer having a series of block buffers operable to store each of the received blocks in a frame to identify the last frame boundary;
advance another block interval;
store, if a block of data was received during the block interval, the block of data in the corresponding block buffer; and
advance a buffer indicator to the next block portion, the buffer indicator further defining an adaptive sliding window of received stream transmissions that includes blocks transmitted during the duration of the previous frame interval, wherein the adaptive sliding window computes an efficiency rate of blocks avoiding transmission from matching the previous corresponding block and adjusts the frame interval to modify the number of blocks in a frame in response to the efficiency rate.

12. A method for transmitting a stream of data arranged in frames of blocks comprising:
establishing a frame interval for receiving a stream of blocks, the blocks arranged in frames according to a frame interval;
receiving a set of blocks corresponding to a frame, the set of blocks including only blocks exhibiting a change from a corresponding block in the previous frame;
storing, in a receive buffer for receiving transmitted frames, a received block if the block has changed from the corresponding block in the previous transmission, the receive buffer storing an ordered sequence of blocks in the frame;
advancing a block pointer to the next block in a sequence of blocks in the frame, the block retaining a value of a previous frame if the received block has not changed; and
accepting, upon receipt of each of the changed blocks in the frame, the receive buffer as the contents of the transmitted frame;
buffering received frames by storing in a frame buffer having a series of block buffers operable to store each of the received blocks in a frame to identify the last frame boundary;
advancing another block interval;
storing, if a block of data was received during the block interval, the block of data in the corresponding block buffer; and
advancing a buffer indicator to the next block portion, the buffer indicator further defining an adaptive sliding window of received stream transmissions that includes blocks transmitted during the duration of the previous frame interval, wherein the adaptive sliding window computes an efficiency rate of blocks avoiding transmission from matching the previous corresponding block and adjusts the frame interval to modify the number of blocks in a frame in response to the efficiency rate.

13. The method of claim 12 wherein the blocks correspond to a sequence defining a frame, each frame including blocks transmittable during a frame interval.

14. The method of claim 13 wherein transmitting occurs via a trunk line for transmitting streams of data corresponding to multiple users by interspersing data of different users over available bandwidth.

* * * * *